United States Patent [19]

Suzuki

[11] Patent Number: 5,083,032
[45] Date of Patent: Jan. 21, 1992

[54] ELECTRON BEAM EXPOSURE APPARATUS

[75] Inventor: Toshiyuki Suzuki, Yokohama, Japan

[73] Assignee: Kabushiki Kaisha Toshiba, Kawasaki, Japan

[21] Appl. No.: 658,656

[22] Filed: Feb. 21, 1991

[30] Foreign Application Priority Data

Feb. 21, 1990 [JP] Japan .................................. 2-40330

[51] Int. Cl.⁵ .......................................... H01J 37/304
[52] U.S. Cl. .................................. 250/492.2; 250/398
[58] Field of Search ................ 250/492.2, 492.22, 398

[56] References Cited

U.S. PATENT DOCUMENTS

Re. 33,193  4/1990  Yamaguchi et al. ............. 250/492.2
4,678,919   7/1987  Sugishima et al. ............ 250/492.22
4,879,473  11/1989  Zumoto et al. ................. 250/492.2

Primary Examiner—Jack I. Berman
Attorney, Agent, or Firm—Oblon, Spivak, McClelland, Maier & Neustadt

[57] ABSTRACT

Stored in the magnetic disk are the lithography data for lithographing a mask pattern and the correction data for correcting the lithography data. The CPU reads the lithography data and correction data from the magnetic disk and compares addresses from the different sources. When the two separate addresses coincide, the electro-optic system lithographs the mask pattern based on the correction data, whereas when the two addresses disagree with each other, it lithographs the mask pattern according to the lithography data.

9 Claims, 9 Drawing Sheets

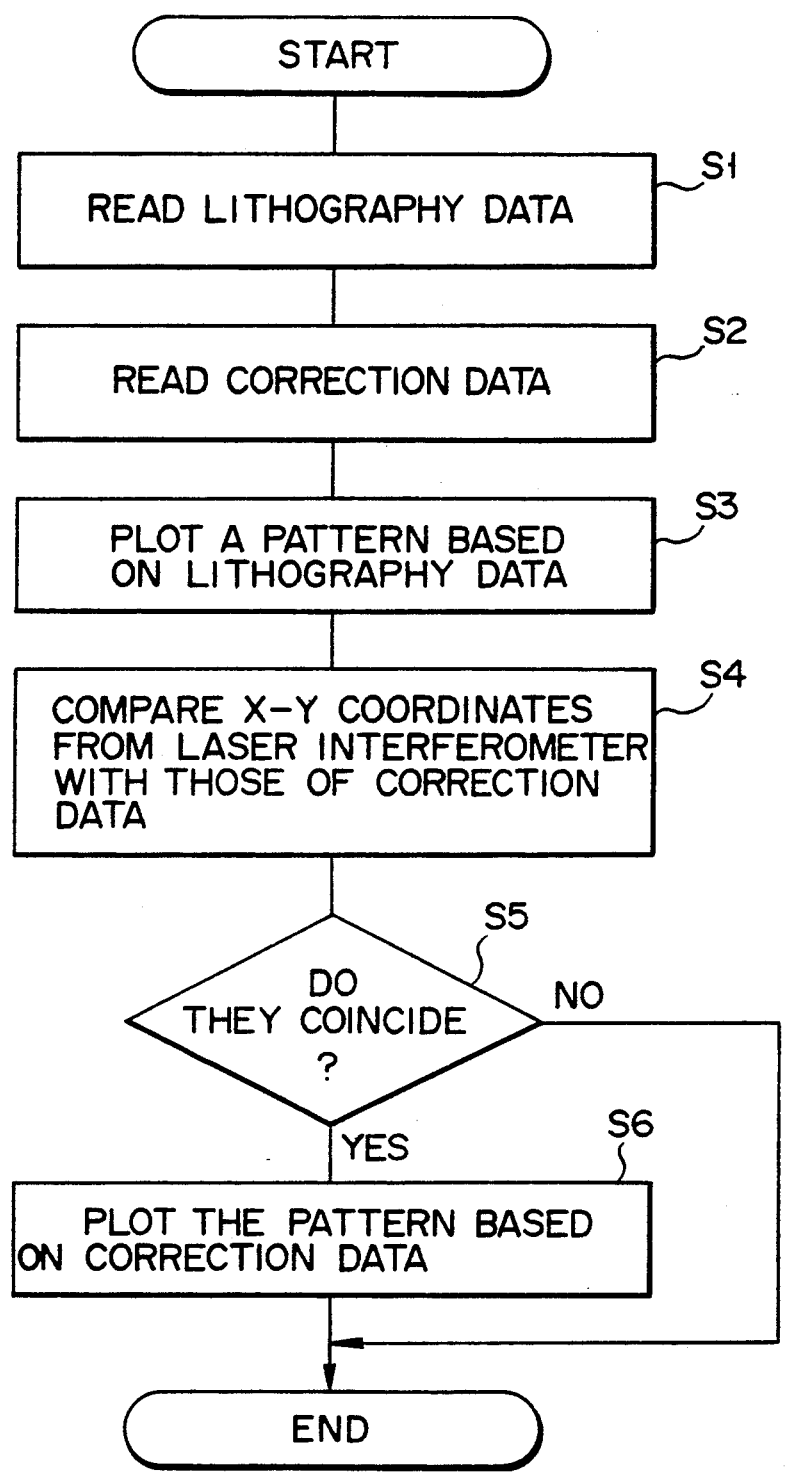
F I G. 5

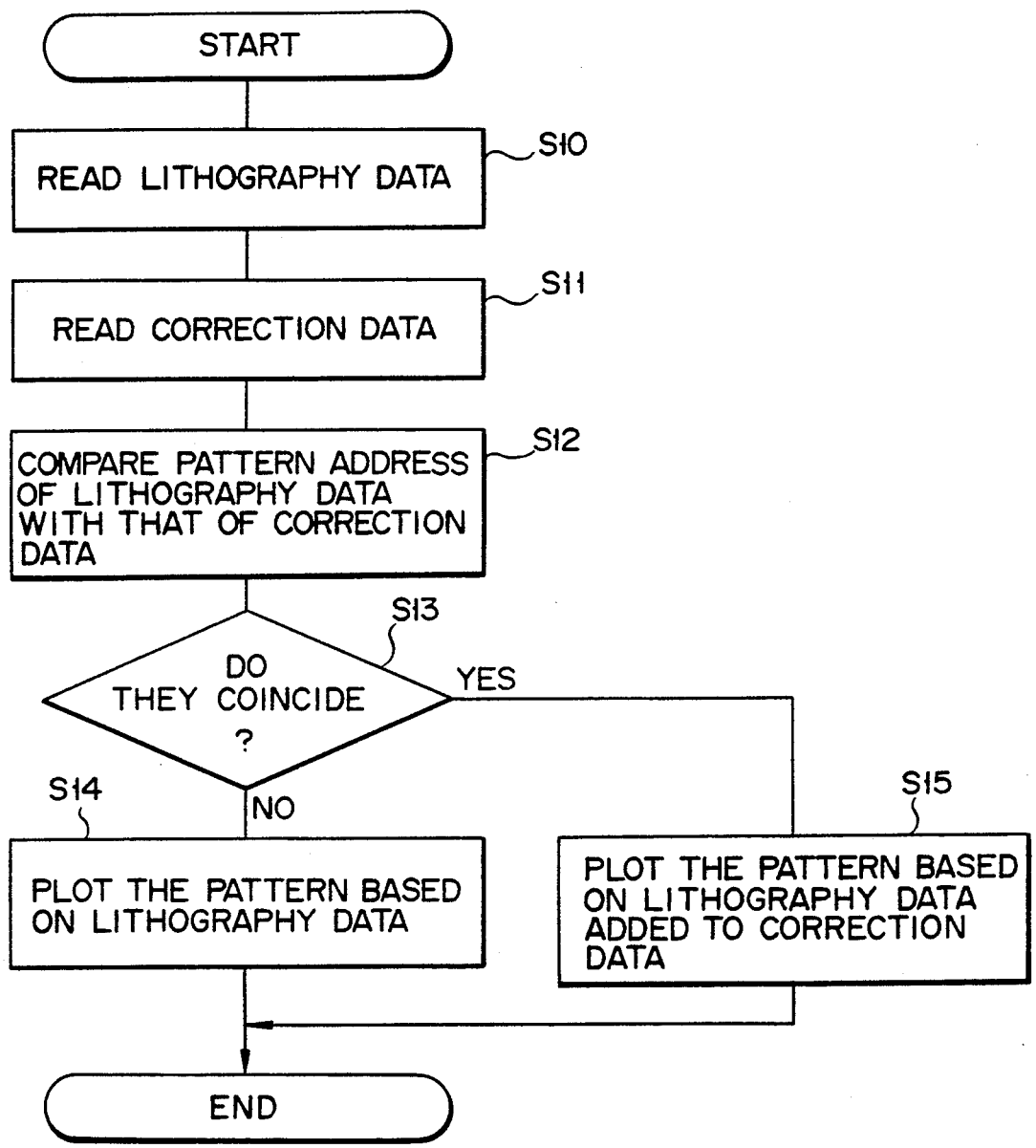
F I G. 9

ELECTRON BEAM EXPOSURE APPARATUS

BACKGROUND OF THE INVENTION

1. Field of the Invention

This invention relates to electron beam exposure apparatus for lithographing a photographic mask pattern for use in the manufacture of semiconductor devices, and more particularly to an electron beam exposure apparatus capable of partially correcting the pattern.

2. Description of the Related Art

To form a photographic mask pattern for lithography, a desired circuit pattern is generally converted into corresponding pattern data with CAD (Computer-Aided Design) system. Then, EBMT (Electron Beam Magnetic Tape)-format lithography data is obtained through the pattern creation processes with a large computer. Based on the lithography data, an electron beam exposure apparatus emits a beam of electrons against a mask blank.

FIG. 11 shows a conventional electron beam exposure apparatus. In this apparatus, EBMT-format lithography data stored on magnetic tape MT1 is loaded into a magnetic disk device 71. A CPU (Central Processing Unit) 72 sequentially reads the lithography data from the magnetic disk device 71 to convert it into various signals, sends a suitable signal to each of a lithography control circuit 73, EOS (Electron Optical System) control system 74, and stage control system 75, and actuates a synchronizing circuit 76. An electro-optic system 80 is controlled by the lithographing control circuit 73, the EOS control system 74, and a stage driving circuit 77 controlled by the stage control system 75. A keyboard connected the CPU 72 is used to enter necessary commands for the operation of the electron beam exposure apparatus.

FIG. 12 illustrates the electro-optic system 80. Electrons generated at an electron gun 81 pass through an anode 82, a first condenser lens 83, blanking electrode 84, second condenser lens 85, object lens (X-Y deflecting electrode) 86, and aperture 87 in sequence, and collide with a mask blank 90 on a cassette 89 mounted on a stage 88. Numeral 91 indicates a reflected electron detector for monitoring beam current. The stage 88 is driven in the X and Y directions with the stage driving circuit 77 controlled by the stage control system 75. A laser interferometer 92 detects stage 88's coordinate addresses, or X-Y coordinates for the pattern on the mask blank which is actually exposed to the beam, on the stage 88, and feeds back the detected X-Y coordinates to the stage control system 75. This allows the accurate positioning of the stage 88.

Electrons produced at the electron gun 81 of the electro-optic system 80 are controlled by the lithography control circuit 73 and EOS control system 74, and radiated against the mask blank 90 on the stage 88. The stage is moved by the stage driving circuit 77 in the stage control system 75, as patterns are lithographed sequentially. When the pattern exposure based on the desired lithography data is completed, the CPU 72 reads the next potting data from the magnetic disk 71 to produce various signals for a subsequent pattern exposure. These actions are repeated to perform successive pattern exposures.

After the creation of the EBMT-format lithography data, some part of the mask design may require partial corrections. For instance, correction of the pattern due to designing errors, CAD errors, changes in circuit specifications and the like needs modification of the mask.

Conventionally, such alteration of mask design involves the large computer again carrying out series of necessary steps to create correct EBMT-format lithography data. However, these reprocesses take a long time, resulting in increased costs. In addition, increased time for pattern correction and inspection reduces the throughput, having an adverse effect on the QTAT (Quick Turn Around Time).

As mentioned above, in a conventional electron beam exposure apparatus, when pattern correction is needed after the creation of EBMT-format lithography data, it is necessary to recreate EBMT-format lithography data, leading to loss of time and a rise in production cost. Additionally more time is needed for pattern correction and inspection, resulting in a decrease in the throughput.

SUMMARY OF THE INVENTION

The object of the present invention is to provide an electron beam exposure apparatus that allows partial correction of pattern lithography without recreating EBMT-format lithography data even when pattern correction is needed even after the creation of EBMT-format lithography data, which helps improve the throughput from design work to mask creation.

This object is achieved by an electron beam exposure apparatus comprising: memory means for storing lithography data used to lithograph a mask pattern, the lithography data containing addresses specifying the lithography position and data corresponding to the magnitude of a beam current for lithographing the mask pattern; supply means for supplying correction data used to correct said lithography data, the correction data containing addresses specifying correction position of the mask pattern and data corresponding to a beam current for correcting the mask pattern; first control means for comparing the address contained in the lithography data with the addresses contained in the correction data; second control means for controlling the magnitude of the beam current based on the data contained in the correction data when the first control means detects the coincidence of the two separate addresses, but based on the data contained in the lithography data when the coincidence is not reached; and exposure means for lithographing a pattern by using an electron beam produced according to the beam current controlled by the second control means.

In this invention, when pattern correction is required after the creation of EBMT-format lithography data, the magnitude of the beam current is controlled to an optimum value based on the correction data prepared to specify partial correction of pattern lithography. This makes it possible to correct the pattern width partially or alter the pattern shape partly without recreating EBMT-format lithography data. Furthermore, since partial correction of pattern plotting can be made without recreating lithography data, the throughput from design work to mask creation can be improved.

BRIEF DESCRIPTION OF THE DRAWINGS

The accompanying drawings, which are incorporated in and constitute a part of the specification, illustrate presently preferred embodiments of the invention, and together with the general description given above

FIG. 5 is a flowchart for the operation of the embodiment in FIG. 1;

FIG. 9 is another flowchart for the operation of the embodiment of FIG. 1

DETAILED DESCRIPTION OF THE PREFERRED EMBODIMENTS

Figure 11:
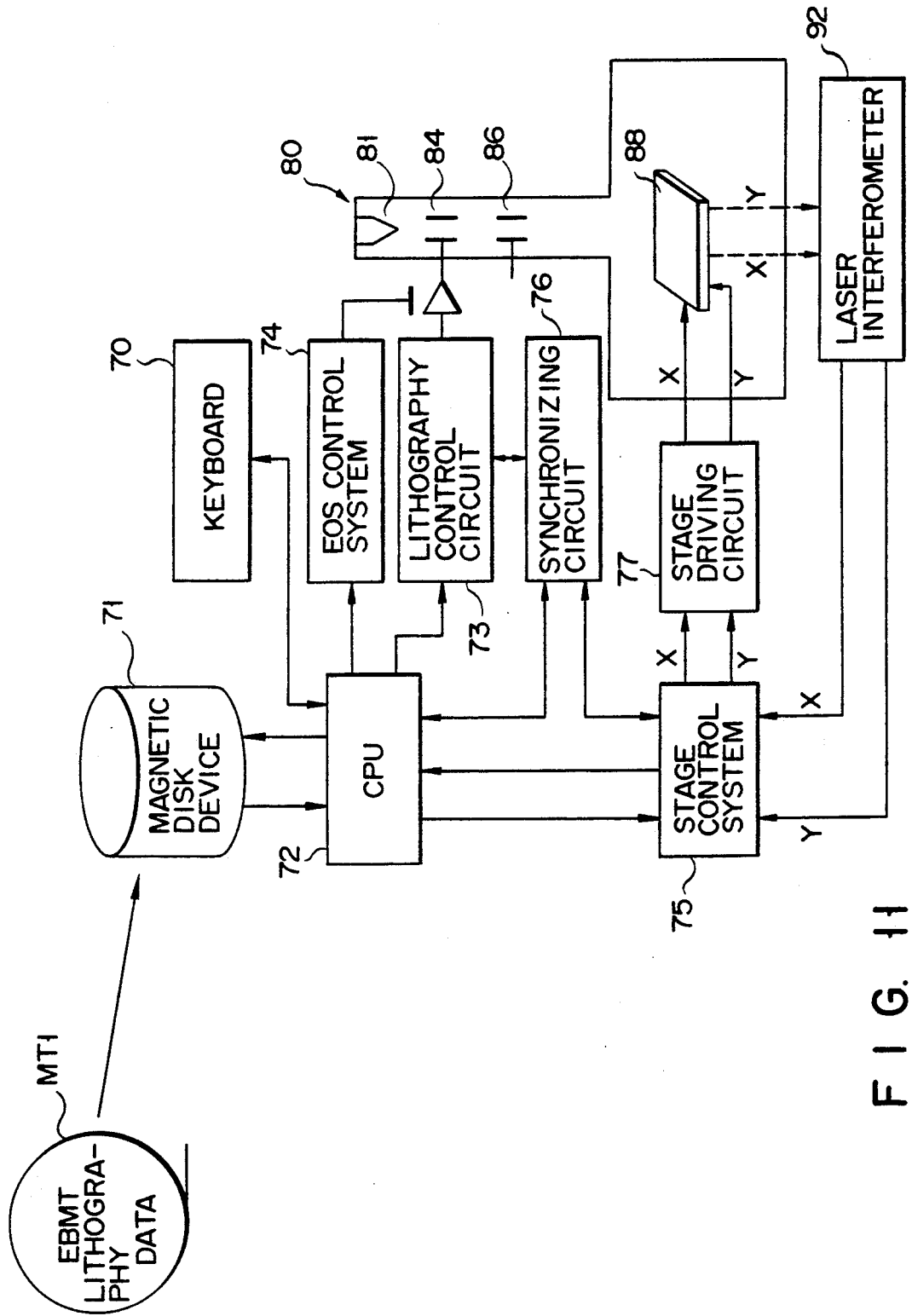
FIG. 11 is a schematic diagram for a conventional electron beam exposure apparatus.

An embodiment of the present invention will be explained in detail, referring to the accompanying drawings. The same parts in FIG. 1 as those in FIG. 11 are represented by the same symbols.

Figure 1:
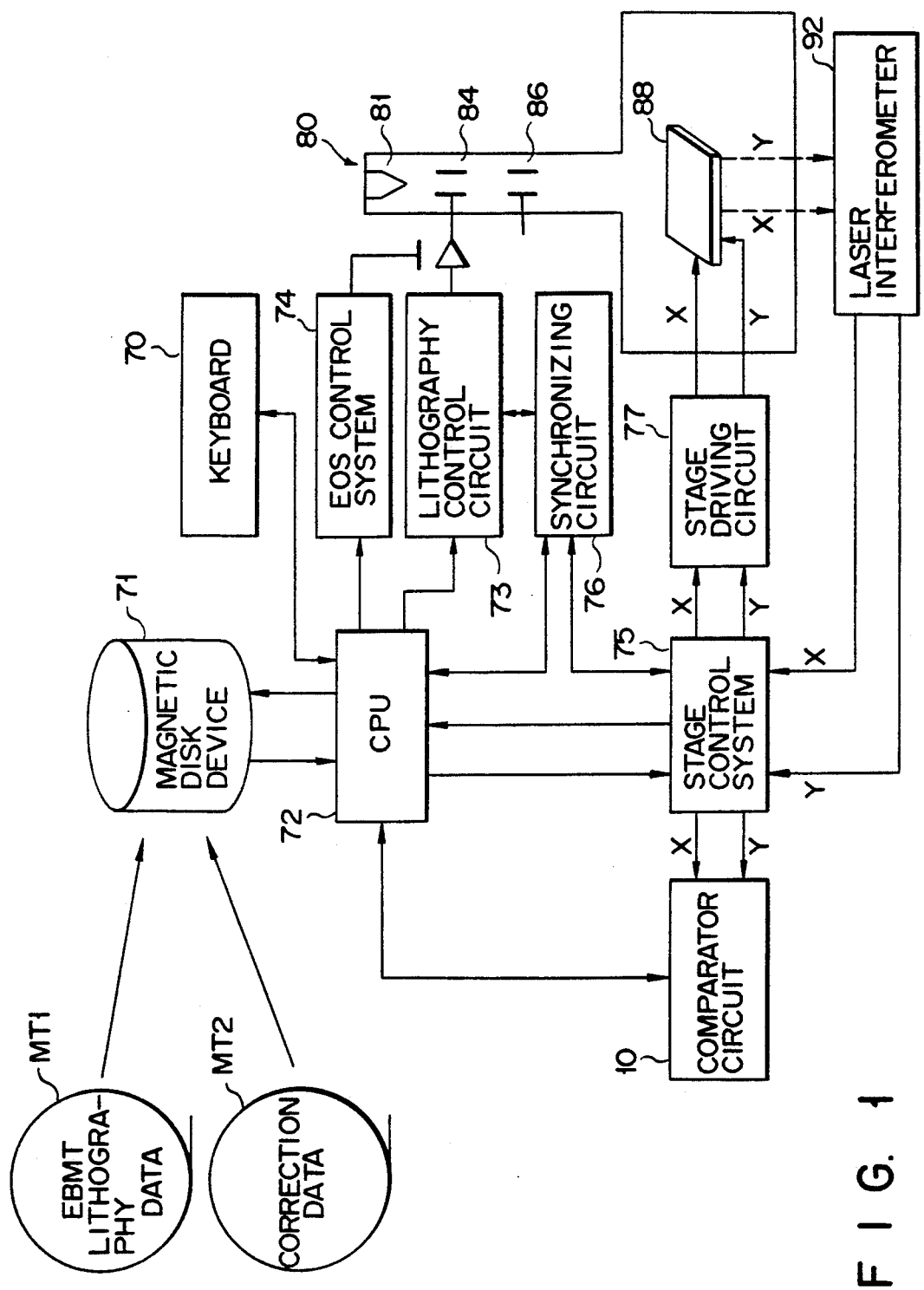
FIG. 1 is a schematic diagram for an electron beam exposure apparatus as an embodiment of the present invention.

In FIG. 1, a CPU 72 is connected to a keyboard 70 for entering data including the above-mentioned commands, a magnetic disk device 71, an EOS control system and a lithography control circuit 73 both for controlling the magnitude of beam current based o the lithography data, a stage control system 75 for controlling the position of the stage, a synchronizing circuit 76 for synchronizing the stage control system 75 with the lithography control circuit 73, and a comparator circuit 10 for comparing the X-Y coordinates from the stage control system 75 with those contained in the correction data from the CPU 72.

EBMT-format lithography data stored in the MT1 and correction data stored in the MT2 are loaded and stored into the magnetic disk 71. The EOS control system 74 and lithography control circuit 73 are connected to the blanking electrode 84 in an electro-optic system 80. The stage control system 75 is connected to a stage driving circuit 77, which drives a stage 88. The stage control system 75 is connected to a laser interferometer 92 that detects X-Y coordinates of the pattern on the mask actually exposed to the beam.

Figure 10:
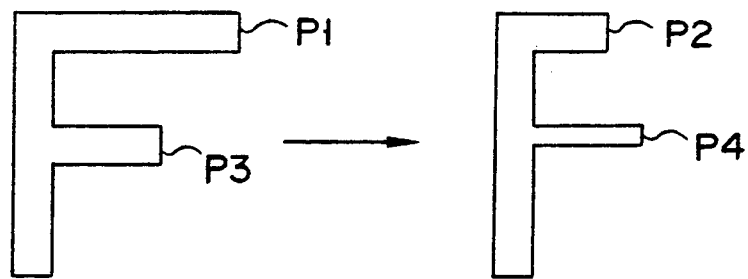
FIG. 10 shows partial correction of a pattern through the operation in FIG. 9.
Figure 12:
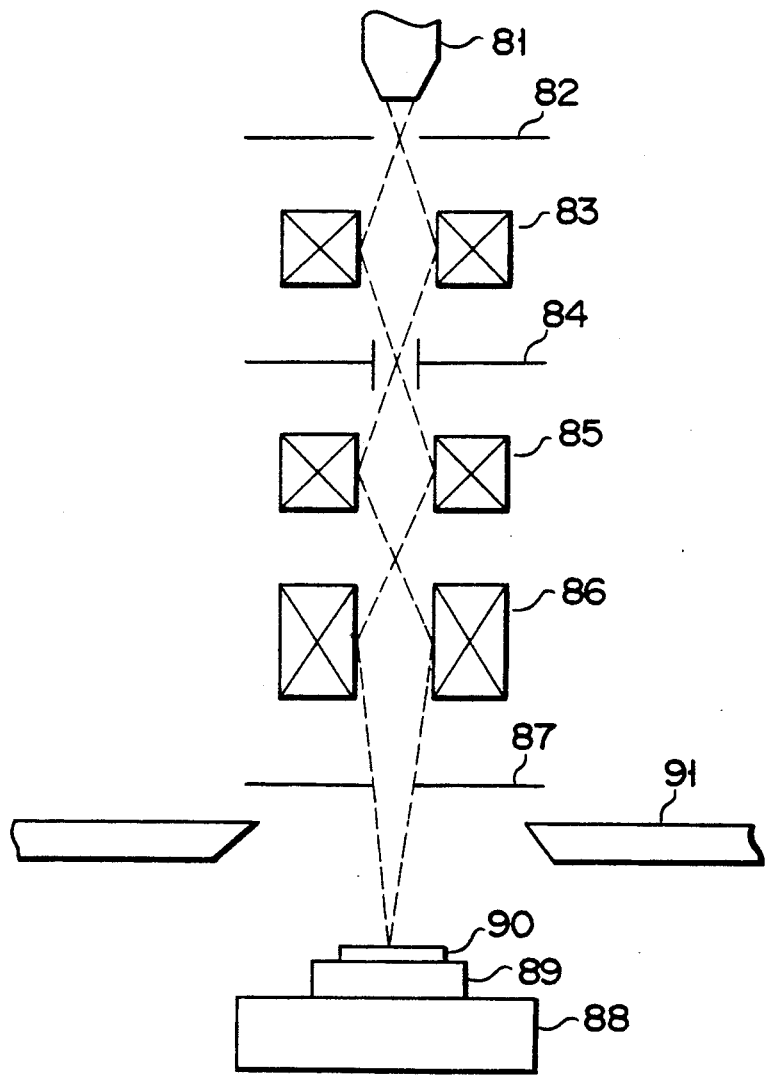
FIG. 12 is a sectional view illustrating beam exposure with the electro-optic system of FIG. 9.

The electron beam exposure apparatus of FIG. 1 differs from the conventional one of FIG. 10 in the following points:

(1) Stored in the magnetic disk device 71 are MT1-stored EBMT-format lithography data and MT2-stored correction data for partial correction of EBMT-format lithography data.

(2) The comparator 10 is provided to compare the X-Y coordinates of the pattern address in the correction data read from the magnetic disk device 71 with the laser interferometer-measured X-Y coordinates of the address for the pattern on the mask blank actually exposed to the beam.

(3) For CPU 72-controlled beam exposure based on the lithography data, when the two separate X-Y coordinates coincide at the comparator 10, the electro-optic system 80 is controlled so as to regulate the beam current according to the pattern correction contained in the correction data read from the magnetic disk device 71.

Figure 2:
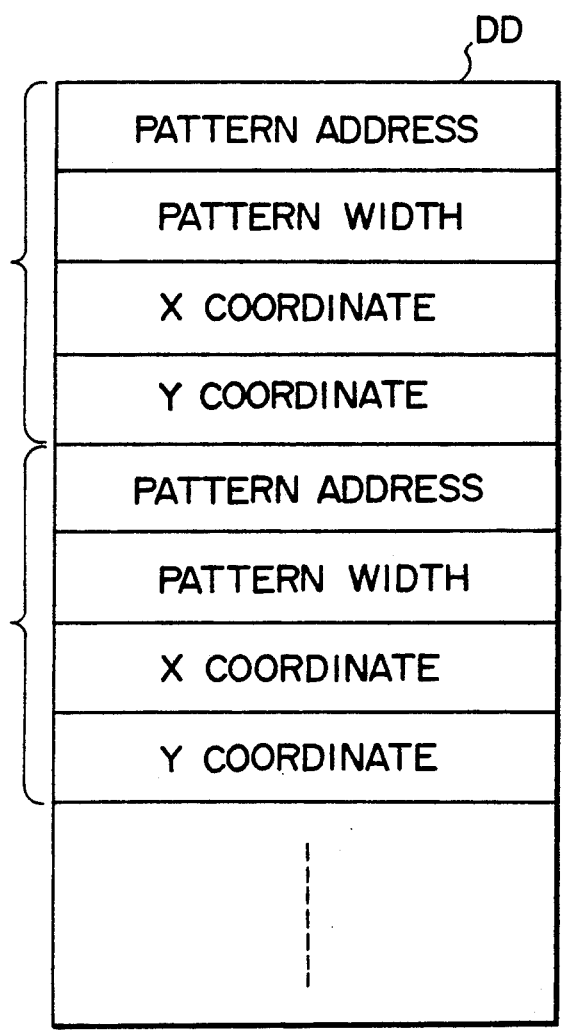
FIG. 2 shows a file structure of lithography data.

FIG. 2 shows a file structure of the EBMT-format lithography data DD. The lithography data DD is made up of pattern addresses, their X-Y coordinates, and values corresponding to a beam current representing the pattern width, for example.

Figures 3, 4:
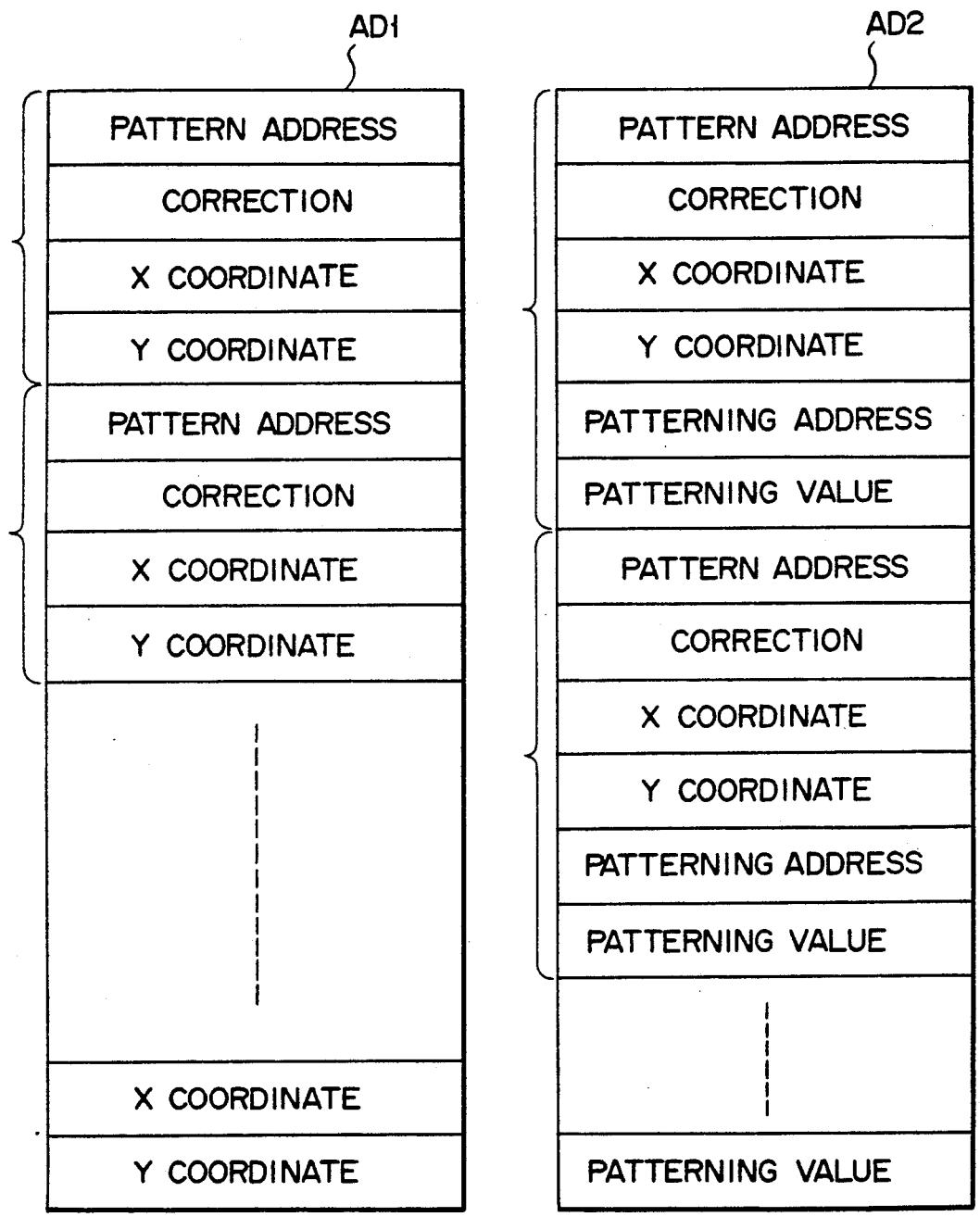
FIGS. 3 and 4 illustrate different file structures of correction data, respectively, stored in the magnetic disk device of FIG. 1.

FIG. 3 illustrates a file structure of the correction data. The correction data AD1 is composed of pattern addresses requiring correction, their X-Y coordinates, correction values corresponding to a beam current to correct for example, the pattern width.

FIG. 4 illustrates another file structure of the correction data. This correction data AD2 is composed of: the pattern addresses needing correction; their X-Y coordinates; correction values corresponding to a beam current to correct the pattern width, for example; patterning addresses required for patterning an additional pattern, for example; and patterning values corresponding to a beam current required for the patterning.

The electron beam exposure apparatus of this embodiment operates the same way as does the aforementioned conventional one when no correction data exists. Here, the CPU 72 reads the lithography data from the magnetic disk 71 in sequence, converts them into different signals, and sends them to the lithography control circuit 73, EOS control system 74, and stage control system 75, respectively. It also synchronizes the stage control system 7 with the lithography control circuit 73 via the synchronizing circuit 76. This controls the electrons generated at the electron gun 81 and the stage movement, which allows continuous pattern exposure. When the pattern exposure based on the desired lithography data is completed, the CPU 72 reads the next lithography data from the magnetic disk 71 to produce and send necessary different signals. It repeats those steps as many times as required, enabling successive pattern exposure.

Referring to FIG. 5, operation will be explained for the case where EBMT-format lithography data and correction data are stored in the magnetic disk 71.

The CPU 71 first reads the EBMT-format lithography data from the magnetic disk 71 (step ST1), and then reads the magnetic disk 71-stored correction data (step ST2). In the electro-optic system 80, the pattern is produced on the mask blank through beam exposure, in the same manner as described above, according to the read-out lithography data (step ST3). During the pattern lithography, the laser interferometer 92-measured X-Y coordinates of the beam lithography-produced pattern on the mask blank is compared with the X-Y coordinates of the pattern addresses contained in the correction data at the comparator circuit 10 (steps ST4 and 5). When the comparison results in disagreement, then the next lithography step will be carried out. When the comparison brings about a coincidence, or when an actually beam-lithographed position on the mask blank is at the correction position, the magnitude of electron beam current in the electro-optic system 8 is controlled according to the corrections contained in the read-out correction data, instead of the EBMT-format lithography data (step ST6).

Therefore, when correction data with the file structure of FIG. 3 is used, the pattern width can be broadened by controlling the magnitude of the electron beam current in the electro-optic system 80 based on the pattern-width corrections contained in the correction data.

Figure 6:
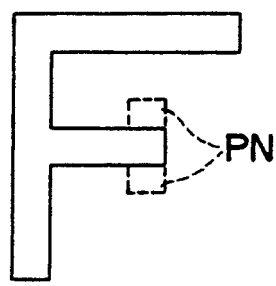
FIG. 6 shows partial correction of a pattern based on the patterning addresses and values both contained in the correction data of FIG. 4.

In the case of using the correction data with the file structure of FIG. 4, the magnitude of the electron beam current is controlled according to the pattern-width corrections contained in the correction data, while the pattern is lithographed on the basis of the patterning addresses and values contained in the correction data. This allows addition of a pattern PN as shown by a broken line in FIG. 6, for example.

With the above embodiment, even when pattern correction is needed after the EBMT-format lithography data has been once created, just preparing correction data enables partial correction of pattern lithography without recreating the EBMT-format lithography data. This improves the throughput.

Figure 7:
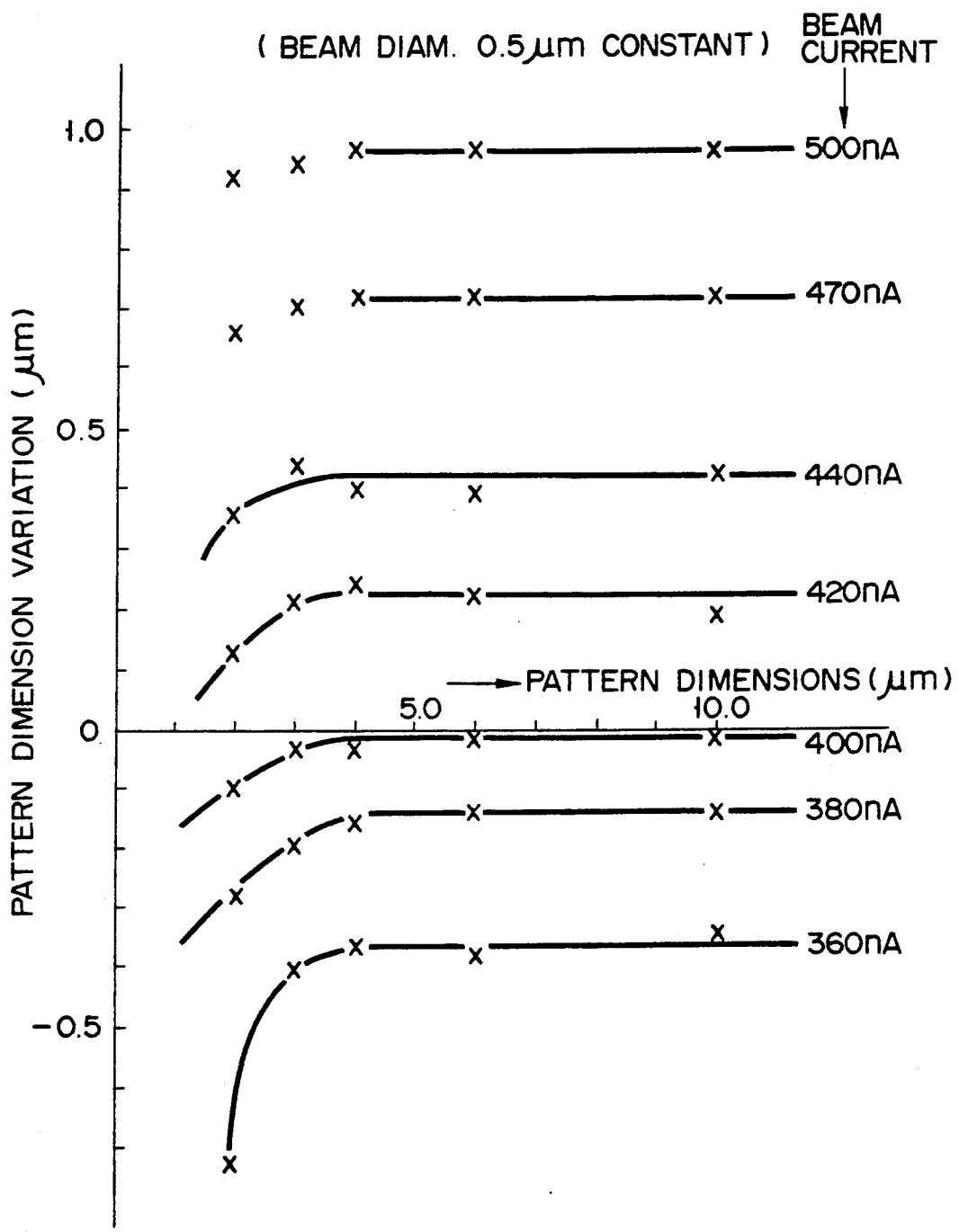
FIG. 7 illustrates the relationship between the measured beam current and pattern dimension variations in the electron beam exposure apparatus of FIG. 1.

FIG. 7 shows the relationship between the beam current and the pattern dimension variations in the electron beam exposure apparatus of the embodiment. In this case, the variations in the pattern-width dimension were measured over the beam current range from 500 nA to 360 nA. In the measurement, the beam diameter was fixed to 0.5 $\mu$m and the development condition after beam exposure was set so that an optimum pattern dimension could be obtained at a beam-current of 400 nA.

From FIG. 7, the following things can be seen:

(1) Changing the magnitude of beam current by 10 nA results in a change in the pattern width by 0.1 $\mu$m, which permits an increment of the pattern correction up to 1.0 $\mu$m and its decrement down to $-0.3$ $\mu$m. That is, a change in the dose by 0.2 $\mu$m C/cm$^{-2}$ changes the pattern dimension by 0.1 $\mu$m.

(2) For 0.5 $\mu$m address unit or less, patterns of 3.0 $\mu$m or more width all allow control of their pattern dimensions.

(3) Because of a restriction on the electron beam brightness, a 0.5 $\mu$m beam diameter permits the magnitude of beam current up to approximately 500 nA and a pattern edge roughness of 0.2 $\mu$m or less allows the beam-current magnitude down to 380 nA.

Figure 8:
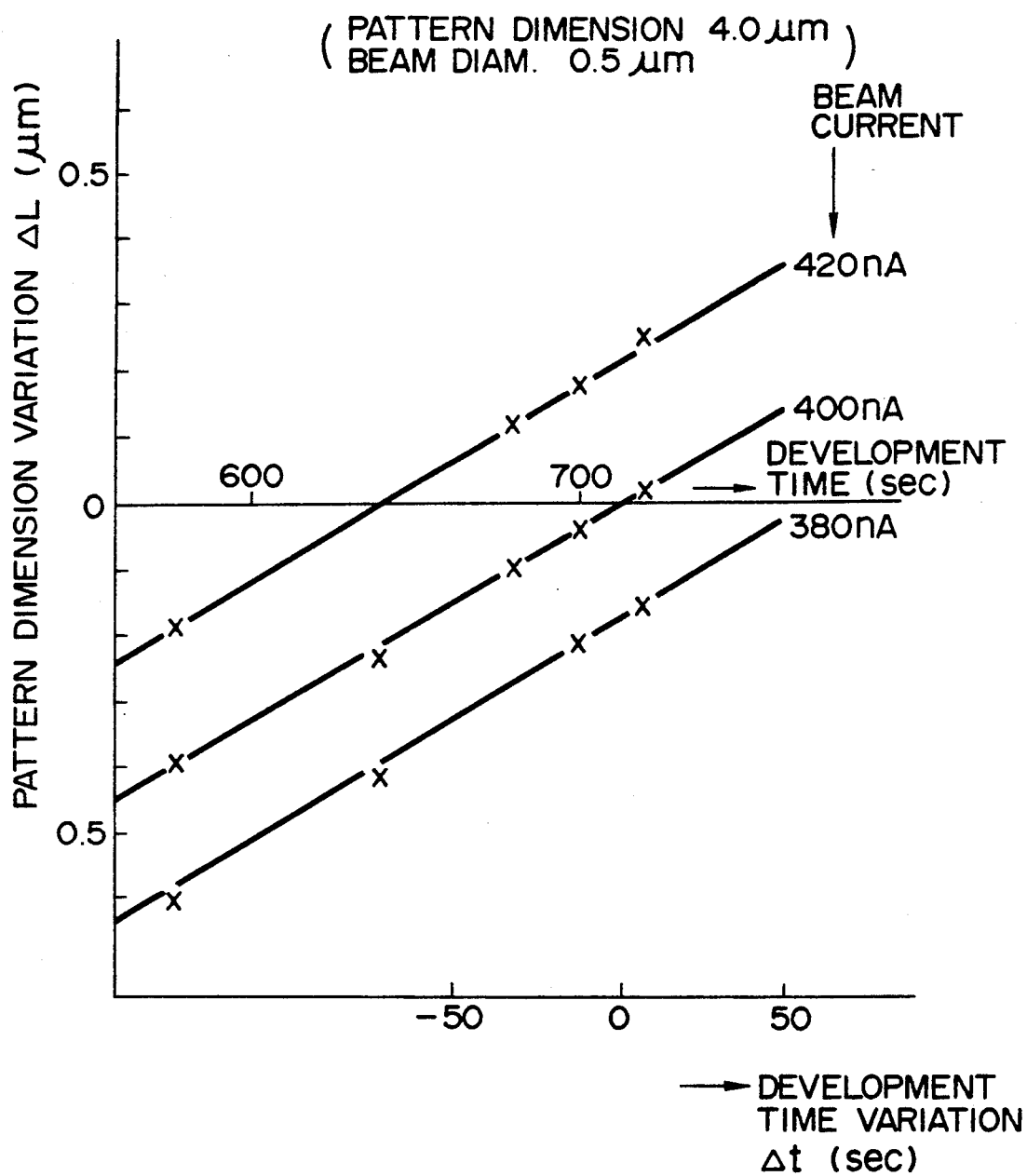
FIG. 8 illustrates the relationship between the measured development time and pattern dimension variations in the electron beam exposure apparatus of FIG. 1

FIG. 8 shows the relationship between the development time and the pattern dimension variations in the above electron beam exposure apparatus. Here, using the magnitude of beam current as parameter, variations in the pattern width are shown with respect to changes in development time after the beam exposure. In this measurement, the beam diameter was fixed to 0.5 $\mu$m and the measurement pattern is 4 $\mu$m in width on data. It is obvious that the development speed is 0.0 $\mu$m/30sec for each beam current.

A change in the pattern width $\Delta L$ is:

$$\Delta L = (I - 400)/10 \times 0.1 + 0.08 \cdot \Delta t/30$$

wherein I is the magnitude of beam current and $\Delta t$ is a change in time which is obtained from difference from between the present time and the development time at which a change in the pattern width $\Delta L$ is zero when electron beam is exposed by beam current of 400 nA.

Accordingly, uniform dimension correction of the pattern on the mask blank through beam exposure can be achieved by changing the beam-current magnitude in increments of 10 nA with respect to 0.1 $\mu$m increments in the dimension correction. Therefore, as mentioned above, controlling the beam-current magnitude based on the correction value of the pattern width enables correction of the pattern at a portion needing dimensional amendments.

Referring to FIG. 9, another operation of the electron beam exposure apparatus of FIG. 1 will be explained.

In this operation, the CPU 72 first reads EBMT-format lithography data from the magnetic disk 71 (step ST10), and then reads the correction data from the magnetic disk 71 (step ST11). It also compares the pattern address contained in the lithography data with the pattern address contained in the correction data (steps ST12 and ST13). When the comparison results in disagreement, or when there is no correction data corresponding to the pattern address to be lithographed, the electron-beam magnitude in electro-optic system 80 is controlled based on the lithography data to lithograph the pattern (step ST14).

On the other hand, when the comparison detects the pattern address contained in the lithography data agreeing with that in the correction data, or when there is a correction data corresponding to the pattern address to be lithographed, the pattern is lithographed by controlling the magnitude of the electron beam current in the electro-optic system 80 in accordance with the correction value contained in the read-out correction data in place of the lithography data (step ST15).

In this embodiment, before the pattern is lithographed, the decision is made about whether there is a correction data corresponding to the pattern address to be lithographed. When the correction data exists, the magnitude of the electron beam current in the electro-optic system 80 is controlled on the basis of the correction value contained in the correction data instead of the lithography data. Thus, in addition to widening and lengthening the pattern, the pattern P1 can be shortened to the pattern P2 and the pattern P3 narrowed to the pattern P4 as shown in FIG. 10.

While in the above embodiments the correction data is written on to the magnetic tape and stored in the magnetic disk 71, it is not restricted to this approach, and may be directly entered from the keyboard 70 connected to the CPU 72.

Although in FIG. 9, comparison of the address contained in the lithography data with that contained in the correction data is performed by the CPU 72, it is not limited to this technique, and may be carried out by the comparator circuit 10.

This invention may be practiced and embodied in still other ways without departing from the spirit or essential character thereof.

The preferred embodiments described herein are therefore illustrative and not restrictive, the scope of the invention being indicated by the appended claims and all variations which come within the meaning of the claims are intended to be embraced therein.

What is claimed is:

1. An electron beam exposure apparatus comprising:
   memory means for storing lithography data used to lithograph a mask pattern, said lithography data containing addresses specifying lithography position and data corresponding to a beam current for lithographing the mask pattern;
   supply means for supplying correction data for correcting said lithography data, said correction data containing X-Y coordinates of addresses specifying the correction position of the mask pattern and data corresponding to a beam current for correcting the mask pattern;

exposure means for emitting electron beam on to the mask according to the lithography data;

detecting means for detecting X-Y coordinates of the pattern on the mask exposed by said exposure means;

comparator mean for comparing the X-Y coordinates of the pattern addresses contained in said correction data and the X-Y coordinates detected by said detecting means; and control means for controlling the magnitude of beam current in said exposure means based on the data corresponding to the beam current contained in said correction data when said comparator detects the coincidence of the two separate X-Y coordinates.

2. An apparatus according to claim 1, wherein said correction data further contains patterning addresses for lithographing a new pattern and data corresponding to a beam current for lithographing this pattern.

3. An apparatus according to claim 1, wherein said supply means constitute a magnetic disk.

4. An apparatus according to claim 1, wherein said supply means constitute a keyboard.

5. An electron beam exposure apparatus comprising:

memory means for storing lithography data used to lithograph a mask pattern, said lithography data containing addresses specifying the lithography position and data corresponding to a beam current for lithographing a mask pattern;

supply means for supplying correction data used to correct said lithography data, said correction data containing addresses specifying the correction position of the mask pattern and data corresponding to a beam current for correcting the mask pattern;

first control means for comparing the addresses contained in said lithography data with the addresses contained in said correction data;

second control means for controlling the magnitude of beam current based on said data contained in said correction data when said first control means detects the coincidence of the two separate addresses, but based on said data contained in said lithography data when the coincidence is not reached; and exposure means for lithographing a pattern using an electron beam produced according to the beam current controlled by said second control means.

6. An apparatus according to claim 5, wherein said correction data further contains patterning addresses used to lithograph a new pattern and data corresponding to a beam current for lithographing this pattern.

7. An apparatus according to claim 5, wherein said correction data contains either pattern-narrowing data or pattern-shortening data each contained in said lithography data.

8. An apparatus according to claim 5, wherein said supply means constitute a magnetic disk.

9. An apparatus according to claim 5, wherein said supply means constitute a keyboard.

* * * * *